United States Patent
Tsai

(10) Patent No.: US 6,714,275 B2
(45) Date of Patent: Mar. 30, 2004

(54) LIQUID CRYSTAL DISPLAY APPARATUS METHOD FOR CHECKING THE JOINING ACCURACY THEREOF

(75) Inventor: Ming-Cheng Tsai, Tainan Hsien (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/993,441

(22) Filed: Nov. 13, 2001

(65) Prior Publication Data

US 2002/0080316 A1 Jun. 27, 2002

(30) Foreign Application Priority Data

Dec. 26, 2000 (TW) ........................................ 89127860 A

(51) Int. Cl.⁷ ............................................ G02F 1/1345
(52) U.S. Cl. ...................... 349/149; 349/150; 349/152
(58) Field of Search ................... 349/149–152; 361/720, 760

(56) References Cited

U.S. PATENT DOCUMENTS 5,729,315 A * 3/1998 Takahashi et al. .......... 349/149
6,211,935 B1 * 4/2001 Yamada ..................... 349/149
6,266,119 B1 * 7/2001 Takahashi et al. .......... 349/149
6,271,480 B1 * 8/2001 Yamaguti et al. ........... 174/260

FOREIGN PATENT DOCUMENTS

EP          0267688          * 5/1998

* cited by examiner

Primary Examiner—Tarifur R. Chowdhury
(74) Attorney, Agent, or Firm—Rabin & Berdo, P.C.

(57) ABSTRACT

The present invention provides an LCD apparatus and a method for checking the joining accuracy thereof. The LCD apparatus comprises an LCD panel, a printed circuit board and a package unit coupled to the LCD panel. On the printed circuit board, there is a plurality of first pins, a first check pad and a second pad, wherein at least one first pin is electrically connected to the first check pad and at least another first pin is electrically connected to the second check pad. There is a plurality of second pins on the package unit, wherein the second pins join the first pins on the printed circuit board correspondingly to connect the first pins electrically. To check the joining accuracy of the LCD apparatus, electric resistance is obtained by measuring the resistance between the first and second check pad with an ohmmeter. When the measured resistance is below a reference value, the assembly quality of the LCD is not qualified.

6 Claims, 3 Drawing Sheets

US 6,714,275 B2

LIQUID CRYSTAL DISPLAY APPARATUS METHOD FOR CHECKING THE JOINING ACCURACY THEREOF

FIELD OF THE INVENTION

The present invention relates to a liquid crystal display, and more particularly to an improved liquid crystal display apparatus and method for checking the joining accuracy thereof.

BACKGROUND OF THE INVENTION

Conventionally, a liquid crystal display apparatus comprises a panel, a drive circuit and a control circuit. The pixels on the panel are driven by the drive circuit and the control circuit is designed to manipulate the drive circuit to control images displayed on the panel. In a liquid crystal display apparatus, the drive circuit is generally set on tape carrier packages (TCP) and the control circuit is laid out on a control circuit board. The TCP is coupled to the panel and the control circuit is coupled to the TCP, wherein the pins on the control circuit are constrained in a predetermined ring to correspond with pins on the TCP to maintain the display quality of the liquid crystal apparatus. Therefore, there is a need to check the joining accuracy of the pins to ensure the quality of the LCD. FIG. 1 shows the conventional method for checking joining accuracy of the pins on the control circuit board and the LCD panel of an LCD apparatus. TCP 1 is coupled to the control circuit 2, and it is difficult to observe the pins 3 on the control circuit 2 because TCP 1 blocks them. One way to check the joining accuracy of the pins is to cut a detection window 5 along the edge of TCP 1 to expose one pin 3 on the control circuit 2 for comparison with the corresponding pin 4 on TCP. All of the pins 3 and 4 are parallel and the pins 3 on the control circuit are designed to correspond with the pins 4 on TCP. If the exposed pin 3 in the detection window 5 is joined to the corresponding pin 4 approximately, the rest of pins match as well.

Conventionally, the pins 3 on the control circuit are joined to the pins 4 on TCP with solder. However, anisotropic conductive film (ACF) has become popular for joining the pins. When the anisotropic conductive film (ACF) is used to join the pins 3 on the control circuit to the pins 4 on TCP, the adhesive resins that are squeezes out will block the observation through the detection window 5. Therefore, it is not easy to check the joining accuracy of the pins when the anisotropic conductive film is chosen to join the pins 3 and 4.

SUMMARY OF THE INVENTION

An object of the present invention is to provide a liquid crystal display apparatus to easily check the joining accuracy of the pins on the control circuit board and the LCD panel.

Another object of the present invention is to provide a method for checking the joining accuracy of the pins on the control circuit board and the LCD panel by measuring the electric resistance between the pins thereon.

To achieve these advantages, a liquid crystal display (LCD) apparatus comprises an LCD panel, a printed circuit board and a package unit coupled to the LCD panel. On the printed circuit board, there is a plurality of first pins, a first check pad and a second pad thereon, wherein at least one first pin is electrically connected to the first check pad and at least another first pin is electrically connected to the second check pad. There is a plurality of second pins on the package unit, wherein the second pins join the first pins on the printed circuit board correspondingly to connect the first pins electrically.

In another aspect of the present invention provides a method for checking assembly accuracy of the pins on an LCD apparatus comprising the steps of:

providing a first check pad and a second check pad on the printed circuit board;

connecting at least one first pin to the first check pad;

connecting at least another first pin to the second check pad; and measuring electric resistance between the first and the second pad to detect the electric resistance between the first and second pins.

According to another aspect of the present invention, the package unit is a tape carrier package (TCP) and the package unit further comprises a driving circuit thereon for driving the LCD panel. The printed circuit board further comprises a control circuit thereon for controlling the driving circuit. The first pins on the printed circuit board can be joined with the second pins on the package unit by anisotropic conductive film ACF or solder.

BRIEF DESCRIPTION OF THE DRAWINGS

The above objects and other advantages of the present invention will become more apparent by describing in detail a preferred embodiment thereof which reference to the attached drawings in which.

DETAILED DESCRIPTION OF THE INVENTION

Figure 1:
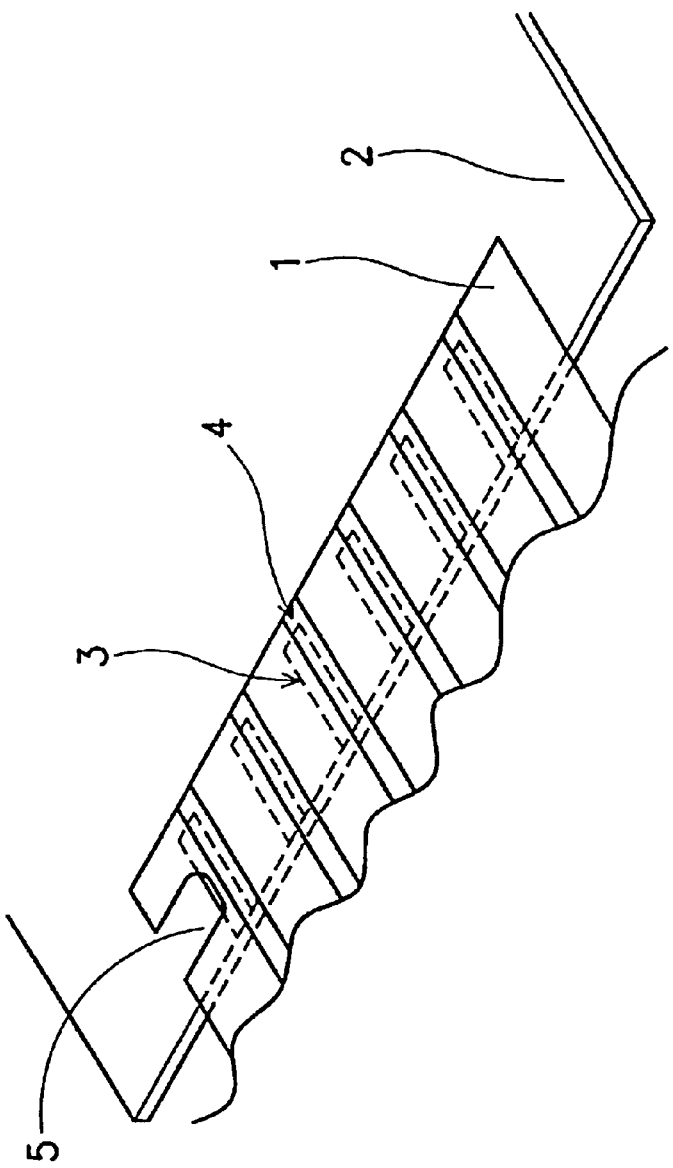
FIG. 1 is a schematic drawing illustrating the conventional design for checking joining accuracy of the pins on the control circuit board and the LCD panel.
Figure 2:
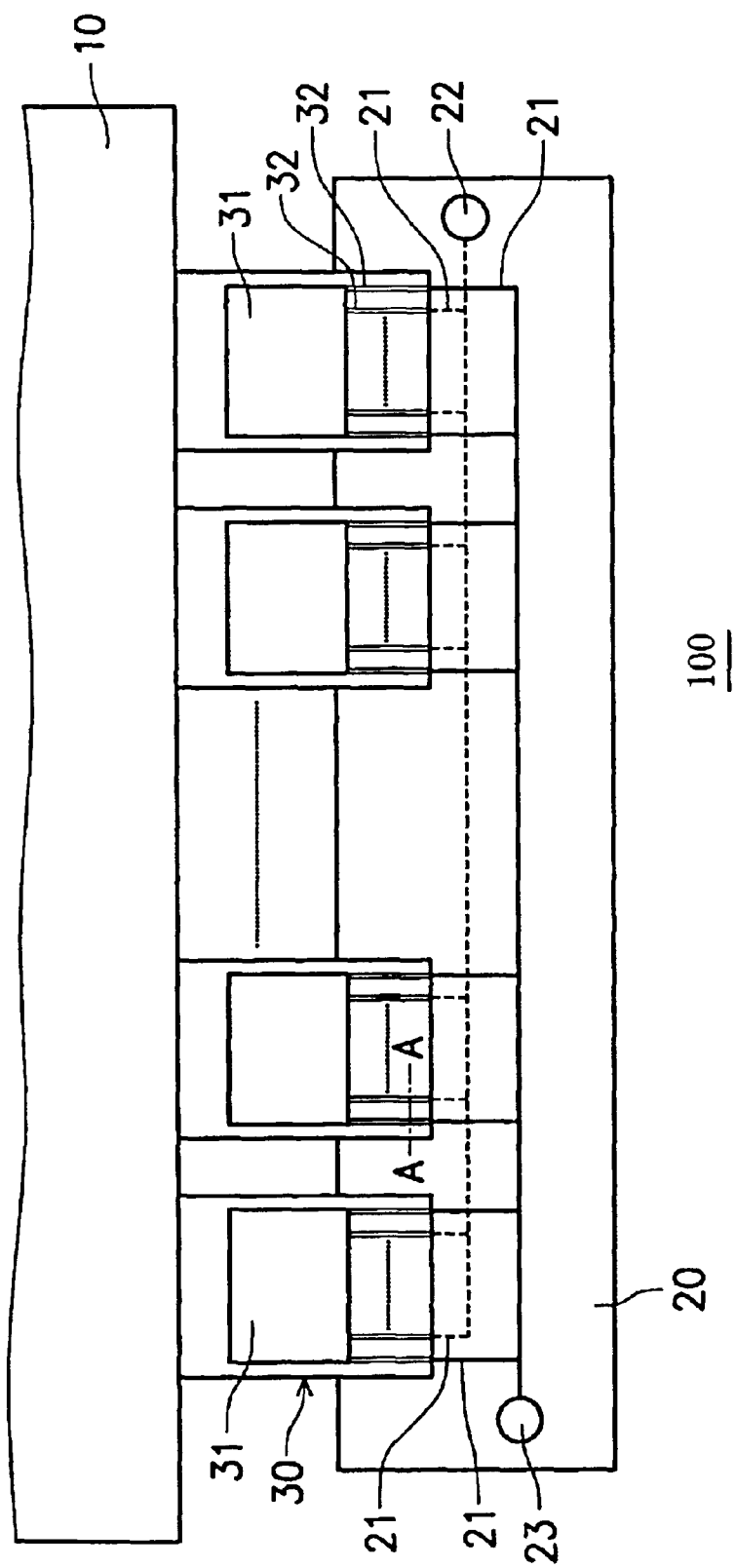
FIG. 2 is a schematic drawing illustrating an LCD apparatus according to one embodiment of the present invention.

FIG. 2 shows an LCD apparatus 100 according to one embodiment of the present invention. The LCD apparatus 100 comprises an LCD panel 10, a printed circuit board 20 and a plurality of tape carrier packages(TCP) 30. There is a plurality of first pins 21, a first check pad 22, a second check pad 23, and a control circuit (not shown) on the printed circuit board 20. On the tape carrier packages (TCP) 30, there are driving circuits 31 on each for driving the LCD panel 10, and a plurality of second pins 32 for joining the first pins on the printed circuit board 20 correspondingly. The tape carrier packages are coupled to the LCD panel 10 and the second pins 32 thereon are joined to the first pins 21 to assemble the tape carrier packages 30 and the printed circuit 20. The first pins 21 and the second pins 32 are joined by anisotropic conductive film or solder. The amount of the tape carrier packages 30 and the second pins 32 thereon depends on the number of pixels displayed in the LCD panel 10's selected resolution.

Figure 3A:
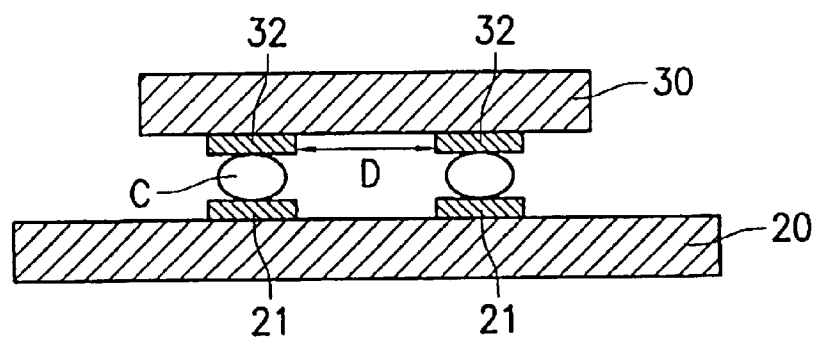
FIGS. 3a and 3b are cross sections of an LCD apparatus according to one embodiment of the present invention.
Figure 3B:
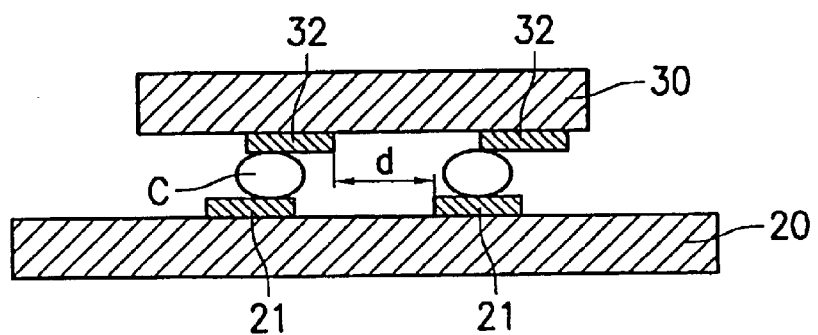

On the printed circuit board, at least one first pin 21 is electrically connected to the first check pad 22 and at least another first pin 21 is electrically connected to the second check pad 23. FIGS. 3a and 3b show the cross sections of the LCD apparatus in FIG. 2 along the A-A' hatch. In FIGS. 3a and 3b, two adjacent first pins 21 are electrically connected to the first check pad 22 and the second check pad 23 respectively. The two adjacent first pins 21 are close but still separated from each other. Therefore, by measuring the electrical resistance between the first check pad 22 and the second check pad 23 with an ohmmeter, an equivalent resistance between the two adjacent first pins 21 can be obtained. The value of the measured equivalent resistance is proportional to the distance between the first pin 21 and the adjacent second pin 32. In FIG. 3a, the first pins 21 on the printed circuit board 20 are joined with the second pins 32 on the tape carrier packages 30 precisely with conductive material C, e.g. anisotropic conductive film or solder, and the distance between the first pins 21 and the adjacent second pin 32 is D, the maximum distance. In FIG. 3b, the first pins 21 on the printed circuit board 20 are joined with the second pins 32 on the tape carrier packages 30 inaccurately, and therefore the distance between the first pins 21 and the adjacent second pin 32 is d, less than D. The measured equivalent resistance is FIG. 3b is smaller than that in FIG. 3a because d<D.

There is an impedance circuit formed when the first check pad 22, the second check pad 23, the first pins 21 connecting to the check pad 22 and 23 and the second pins 32 corresponding to the first pins 21 are connected. The maximum equivalent resistance is obtained when the distance between the first pins 21 and the adjacent second pin 32 is D.

When the distance d is smaller than D, which means the first pins 21 on the printed circuit board 20 are joined with the second pins 32 on the tape carrier package 30 inaccurately, the equivalent resistance measured will be smaller than the maximum equivalent resistance. A reference equivalent resistance can be predetermined according to the maximum value. After the LCD panel 10 is assembled with the printed circuit board 20 by the tape carrier packages 30, an equivalent resistance can be measured by an ohmmeter which connects the first and second check pad 22 and 23. If the measured equivalent resistance is below the reference value, the joining quality of the pins 21 and 32 of the LCD apparatus is not qualified.

According to the present invention, even when anisotropic conductive film is chosen to join the pins 21 and 32 and excess material blocks the joined pins 21 and 32, it is still easy to check the joining accuracy of the pins by measuring the equivalent resistance.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A liquid crystal display (LCD) apparatus, comprising:
   an LCD panel;
   a printed circuit board with a plurality of first pins, a first check pad and a second check pad thereon, at least one first pin electrically connected to the first check pad and at least another first pin electrically connected to the second check pad; and
   a package unit coupled to the LCD panel with a plurality of second pins thereon corresponding to the first pins, wherein the second pins are electrically connected to the first pins.

2. The LCD apparatus as claimed in claim 1, wherein the package unit is a tape carrier package (TCP).

3. The LCD apparatus as claimed in claim 2, wherein the package unit comprises a driving circuit thereon for driving the LCD panel.

4. The LCD apparatus as claimed in claim 3, wherein the printed circuit board comprises a control circuit thereon for controlling the driving circuit.

5. The LCD apparatus as claimed in claim 4, wherein the second pins are electrically connected to the first pins by a anisotropic conductive film (ACF).

6. The LCD apparatus as claimed in claim 4, wherein the second pins are electrically connected to the first pins by solder.

* * * * *